US006662437B2

United States Patent
Kawashima

(10) Patent No.: US 6,662,437 B2
(45) Date of Patent: Dec. 16, 2003

(54) APPARATUS AND METHOD FOR MOUNTING ELECTRONIC COMPONENTS

(75) Inventor: Tomio Kawashima, Ota (JP)

(73) Assignee: Sanyo Electric Co., Ltd., Osaka (JP)

( * ) Notice: Subject to any disclaimer, the term of this patent is extended or adjusted under 35 U.S.C. 154(b) by 178 days.

(21) Appl. No.: 09/730,838

(22) Filed: Dec. 7, 2000

(65) Prior Publication Data

US 2002/0069524 A1 Jun. 13, 2002

(51) Int. Cl.[7] .............................. B23P 19/00; H05K 3/30
(52) U.S. Cl. .............................. 29/740; 29/743; 29/832; 29/833
(58) Field of Search ..................... 29/743, 740, 832, 29/833, 709

(56) References Cited

U.S. PATENT DOCUMENTS

| 5,285,888 | A | * | 2/1994 | Izume et al. ............ 198/341.05 |
| 5,287,616 | A | * | 2/1994 | Suzuki et al. ................. 29/740 |
| 5,305,518 | A | * | 4/1994 | Okumoto ..................... 29/740 |
| 5,400,497 | A | * | 3/1995 | Watanabe et al. ............. 29/705 |
| 5,541,834 | A | * | 7/1996 | Tomigashi et al. ............ 29/739 |
| 5,544,411 | A | * | 8/1996 | Kano et al. .................... 29/740 |

FOREIGN PATENT DOCUMENTS

JP         07-154097         6/1995

* cited by examiner

Primary Examiner—Allan N. Shoap
Assistant Examiner—Isaac N. Hamilton
(74) Attorney, Agent, or Firm—Morrison & Foerster LLP

(57) ABSTRACT

In the invention, there is provided an apparatus for mounting electronic components in which a plurality of mounting heads pick up electronic components concurrently from a plurality of component feeding units for mounting the electronic components on a print circuit board, with assured pick-up and holding of the electronic components.

The component feeding units 3 do not always have an identical pick-up position 10 among all the units 3 used in a mounting operation because of the variation in the manufacturing and the mounting of the units. The shift due to the variation along the direction of feeding, the Y direction, is corrected by moving the position of the nozzle 21 along the Y direction with a controlled rotation of the mounting head 7 around an horizontal axis using the nozzle selection motor 22 for selecting the nozzle 21.

3 Claims, 10 Drawing Sheets

APPARATUS AND METHOD FOR MOUNTING ELECTRONIC COMPONENTS

BACKGROUND OF INVENTION

1. Field of the invention

The present invention relates to an apparatus and a method for mounting electronic components in which a plurality of mounting heads pick up electronic components concurrently from a plurality of component feeding units for mounting the electronic components on a print circuit board.

2. Prior art

Such apparatus and methods for mounting electronic components are capable of reducing the cycle time of the mounting operation as a plurality of electronic components are picked up by a plurality of mounting heads concurrently from a plurality of component feeding units. A typical example is described in a Japanese patent laid-open publication No. Hei 7-154097.

However, the component feeding units do not always have an identical pick-up position among all the units used in a mounting operation. Rather, there is a variation in such position along the direction of component feeding because the component feeding units are not always made identically and because the units are not necessarily mounted on the main body of the mounting apparatus with a good reproducibility. Thus, the position of the suction nozzle relative to an electronic component at the time of picking up the electronic component is not sustained among the mounting operations. In some cases, this leads to a failure in picking up and holding the electronic component by the suction nozzle from a certain component feeding unit. This shortcoming is more pronounced when smaller electronic components are handled by the apparatus for mounting electronic components. For example, when so-called 1005 components having a size of 1 mm×0.5 mm are handled by the apparatus, a shift, as small as 0.2 mm, of suction nozzle from a proper position relative to the electronic component for picking up the component can cause the failure in picking up and holding the electronic component.

SUMMARY OF THE INVENTION

The present invention involves apparatus and methods in which suction and holding of electronic components by a suction nozzle is secured at the time of picking up electronic components from a component feeding unit.

In an embodiment of the present invention, there are provided an apparatus as well as a method for mounting electronic components in which a plurality of mounting heads pick up electronic components concurrently from a plurality of component feeding units for mounting the electronic components on a print circuit board. The apparatus has a plurality of suction nozzles disposed on the mounting head in a radial configuration, a means for rotating the mounting head around a horizontal axis thereof such that the suction nozzles rotate around the axis, and a means for moving the mounting head horizontally for picking up and mounting the electronic components. The inevitable bias shift of the suction nozzle relative to an electronic component from a proper position for picking up the electronic component is corrected along a direction of component feeding of the component feeding unit by rotating the mounting head.

In other embodiment of the present invention, the bias shift is estimated from a predetermined number of pick-up procedures of the electronic component at an occasion of a production operation, such as a preparatory testing before a mounting operation, a start of a mounting operation, and a time in the middle of a mounting operation. The suction nozzle comes to a proper position for picking up the electronic component by correcting the bias shift with a rotation of the mounting head around the horizontal axis after the predetermined number of pick-up procedures for estimating the bias shift.

As the bias shift is relatively small in nature with a typical example being 0.2 mm as described above, a change in position of the suction nozzle by the rotation of the mounting head, not a horizontal movement of the mounting head, is enough to correct the shift. Thereby the suction nozzle securely picks up and holds the electronic component.

BRIEF DESCRIPTION OF THE DRAWINGS

The present invention may be better understood, and its objectives, features and advantages may be made apparent to those skilled in the art, referencing the accompanying drawings.

DETAILED DESCRIPTION OF THE PREFERRED EMBODIMENTS

Figure 1:
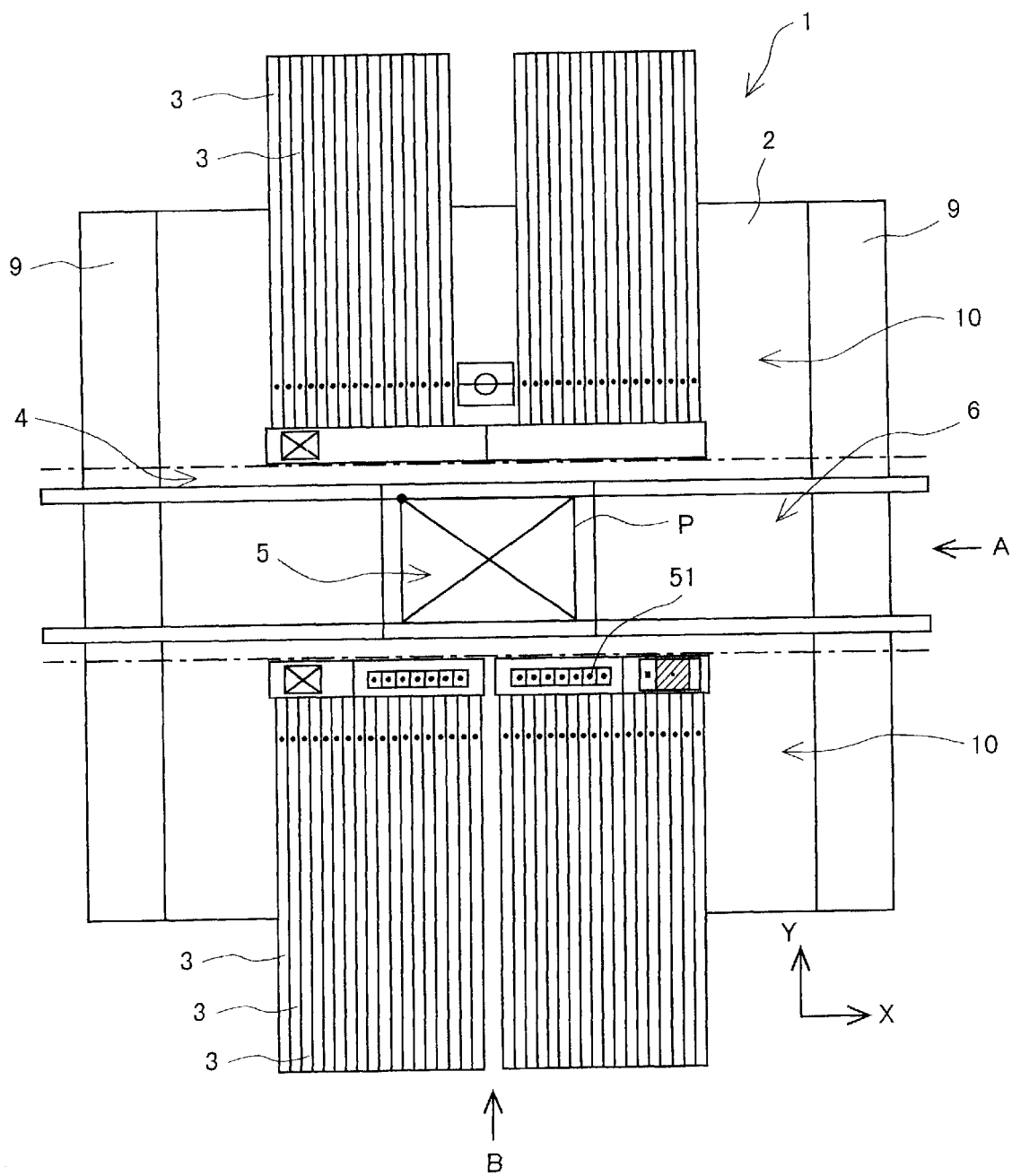
FIG. 1 is a plan view of an apparatus for mounting electronic components as an embodiment of the present invention.

A few preferred embodiments of the present invention will be described in detail hereinafter in reference to the above drawings. FIG. 1, is a plan view of an apparatus for mounting electronic components 1 of the present invention. There are provided on a base 2 of the apparatus 1 a plurality of component feeding units 3 for feeding various kinds of electronic components to a pick-up position 10, where the electronic components are picked up by suction nozzles as will be described later. In principal, one feeding unit 3 contains one type of electronic components, and feeds one component at one procedure of the mounting operation. There are also provided between the two groups of the component feeding units 3 facing to each other an incoming conveyer 4, a portion for positioning 5, and an outgoing conveyer 6. A print circuit board P is transported by the incoming conveyer 4 from an upstream process to the portion for positioning 5, positioned by a positioning mechanism not shown in the figure for the mounting of electronic components at the portion for the positioning 5, and transported away to a downstream process by the outgoing conveyer 6.

Figure 2:
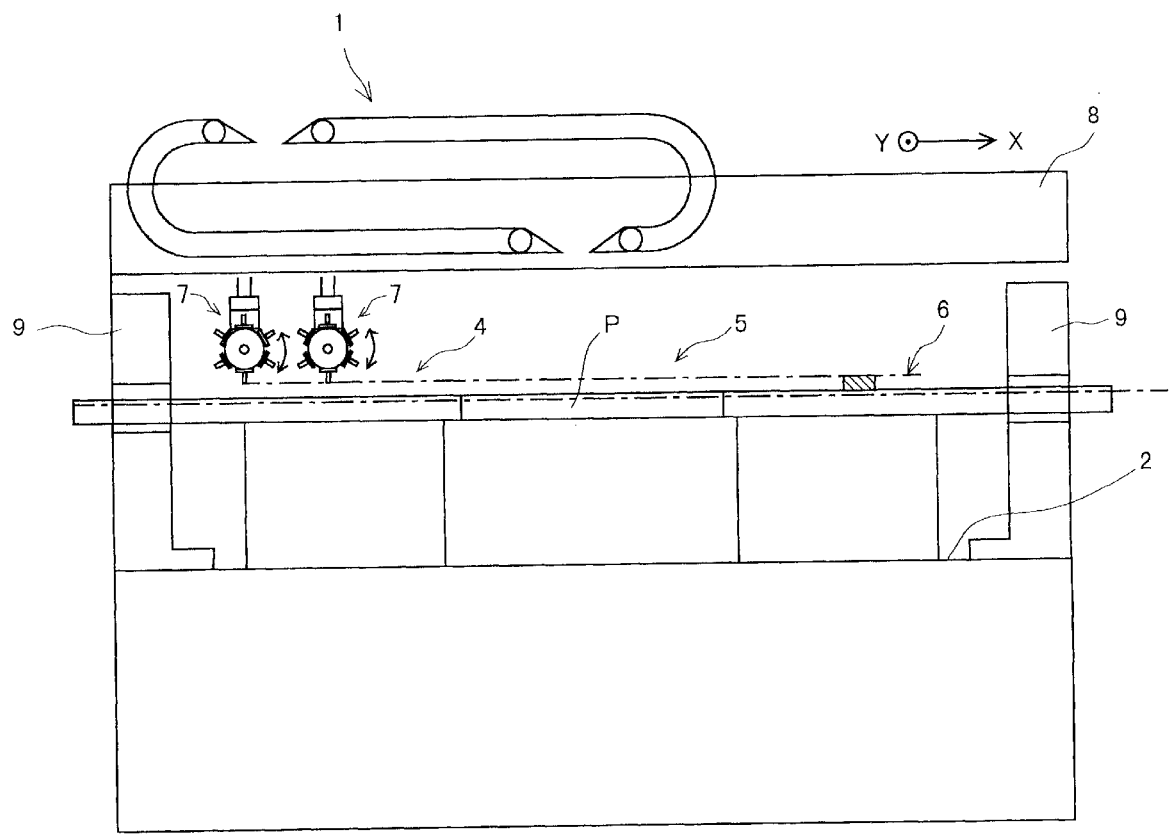
FIG. 2 is a side view of the apparatus shown in FIG. 1 being viewed from the direction shown as B in the figure.

In FIG. 1, mounting heads are not shown for the clarity of showing the structure of the apparatus for mounting electronic component underneath the mounting heads. The overall configuration including the mounting heads 7 is shown in FIG. 2. As seen from the figure, the mounting heads 7 travel above the print circuit board P resting at the portion for positioning 5 and the component feeding units 3.

A beam 8 is placed in the X direction, and travels above the print circuit board P and the component feeding units 3, especially the pick-up positions of electronic components thereof, along the Y direction on a guide 9. The pick-up positions of electronic components are linearly aligned along the X direction. A flexible cableveyer is attached to the beam 8 for holding power cables and air tubes for the suction nozzles.

Figure 3:
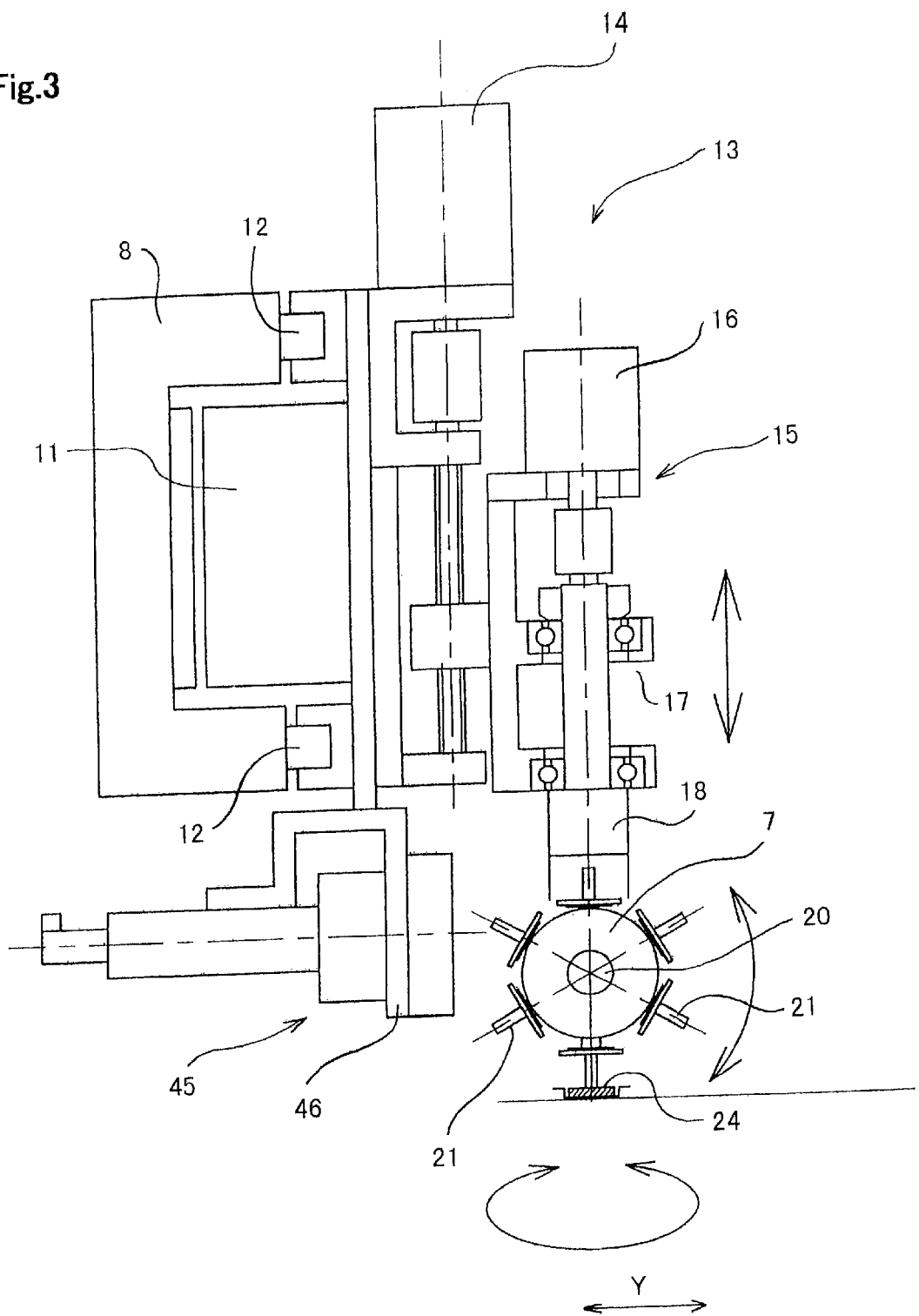
FIG. 3 is to show an electronic component held by a suction nozzle, and a side view of the apparatus shown in FIG. 1 being viewed from the direction shown as A in the figure.
Figure 4:
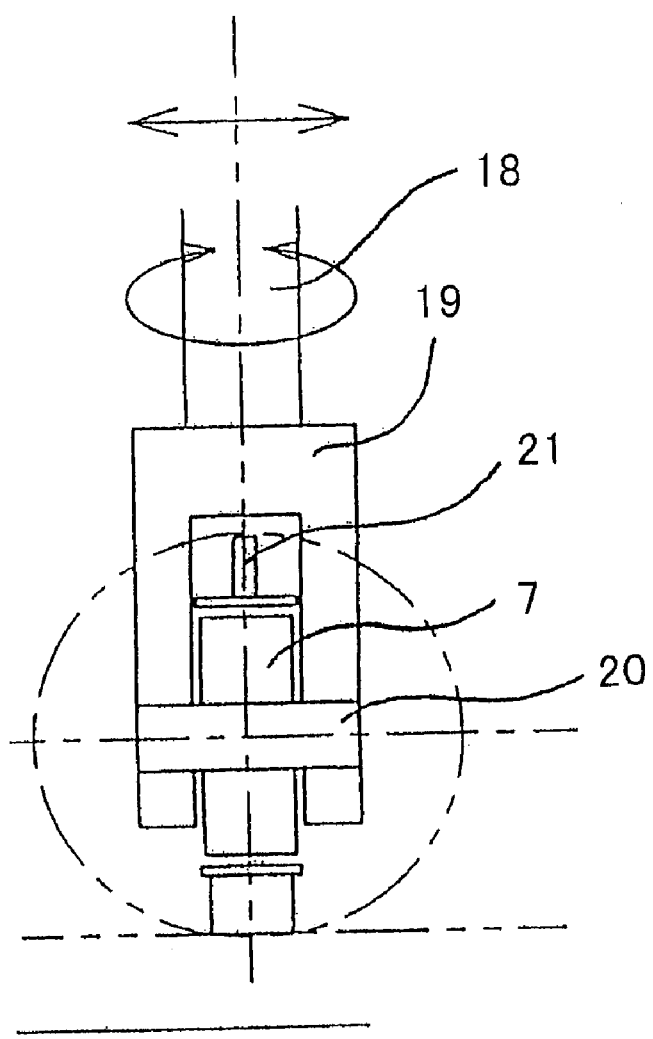
FIG. 4 is a simplified side view of a mounting head in an embodiment of the present invention.

As shown in FIG. 3, which is a view being viewed form the direction shown by the arrow A in FIG. 1, the beam 8 has two X-moving units which move independently on the guide 12 along the X direction, which is the longitudinal direction of the beam 8, driven by an X-axis linear motor 11. For a viewing convenience, only one X-moving unit is shown in the figure. Each X-moving unit has a vertical-axis motor 14 for vertically moving a head block 15, thereby changing the vertical position of the mounting head 7. The head block has the mounting head 7 which can rotate along a vertical axis through bearings 17 driven by an angle correction motor 16. As shown conceptually in FIG. 4, the mounting head is disposed in a holder 19, which is mounted on a vertical axis portion 18, such that the head 7 and a horizontal-axis component 20 can rotate together around a vertical axis driven by the angle correction motor 16.

Thus, the two mounting heads 7 independently can move along the X direction, rotate around a vertical axis, move vertically, and move together along the Y direction.

Figure 6:
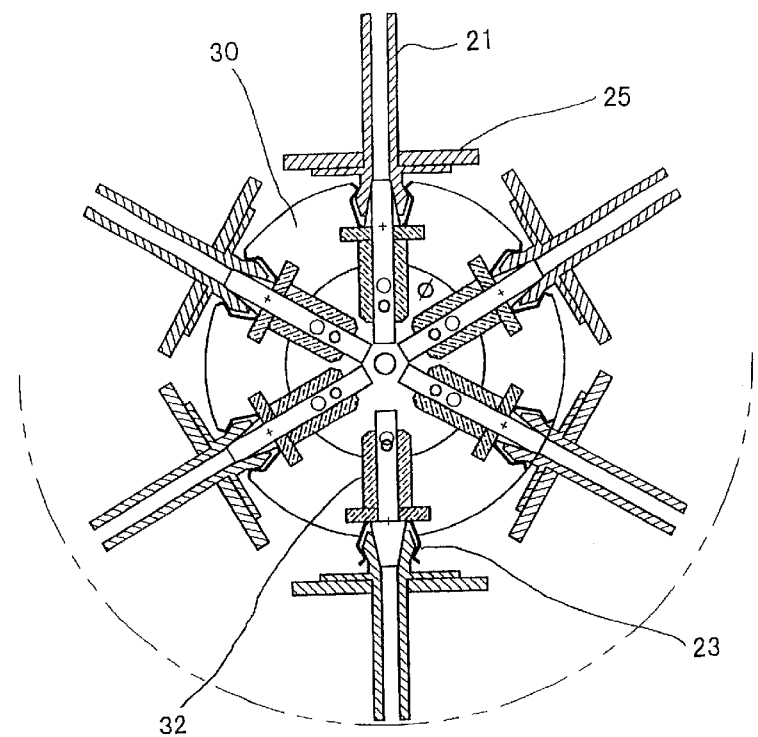
FIG. 6 is a cross-sectional view of a mounting head to show the engagement of the suction nozzles to the nozzle holder in an embodiment of the present invention.
Figure 7:
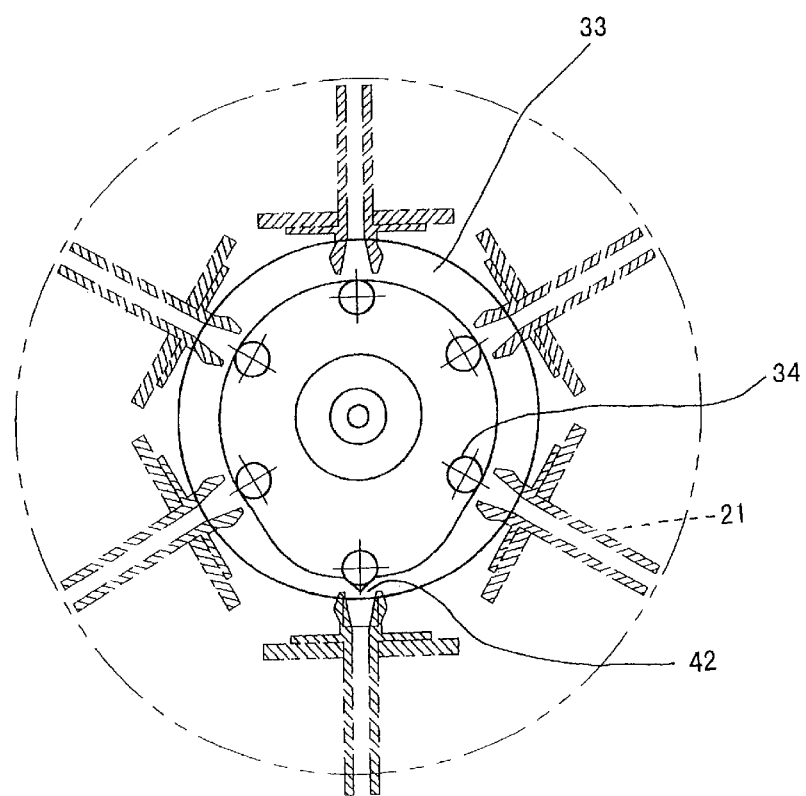
FIG. 7 shows a cum and cum followers equipped in a mounting head in an embodiment of the present invention.

Now, the mounting head 7 will be described in more details in reference to FIG. 5, FIG. 6 and FIG. 7. The mounting head 7 includes the horizontal-axis portion 20, a nozzle fixture 26 for fixing suction nozzles 21 thereon, and a nozzle holder 27 for housing the nozzle fixture 26. Each mounting head has six suction nozzles 21 which are radially disposed around the fringe of the mounting head 7 with an interval of 60 degree. In a base configuration, all the six suction nozzles 21 fixed on a mounting head 7 are different, and selected for a use depending on the size of the component to be mounted on a print circuit board P. The number of the suction nozzle 21 fixed on a mounting head 7 is not confined to that of this embodiment, six. In other embodiments, this number can be larger or smaller than six. In this configuration, the mounting head 7 rotates around a horizontal axis driven by a nozzle selection motor 22, which is mounted on a holder 19, for moving a selected suction nozzle 21 down to a position for picking up an electronic component.

Each suction nozzle 21 has a circular reflection plate 25 at the mid portion thereof and is fixed in a hollow nozzle fixture 26, which moves in a guiding space inside the horizontal-axis component 20, in an attachable and detachable fashion with an engagement portion 23. The nozzle holder 27 is pushed away from the horizontal-axis component 20 by a spring 28 inserted between the two members. A guide 31 and a rail 32 compose a linear guide. When the horizontal-axis component 20 rotates, the rail 32 fixed on the nozzle holder 27 is guided by the guide 31 fixed on a guide fixture 30 of the horizontal-axis component 20. Thus, the cum follower 34 is guided along the inside surface of the cum 33 for changing the distance between the center of the cum 33 and the nozzle holder 27 as well as the suction nozzle 21.

When the cum is locked by a locking mechanism, which will be described later, the nozzle 21 and the nozzle holder 27 rotates guided by the cum follower 34, which is fixed on the fringe portion of the side wall of the nozzle holder 27 and pushed by the spring 28 against the inside surface of the cum 33, which is placed around the horizontal-axis component 20 rotating through bearings 29 driven by the nozzle selection motor 22.

Figure 5:
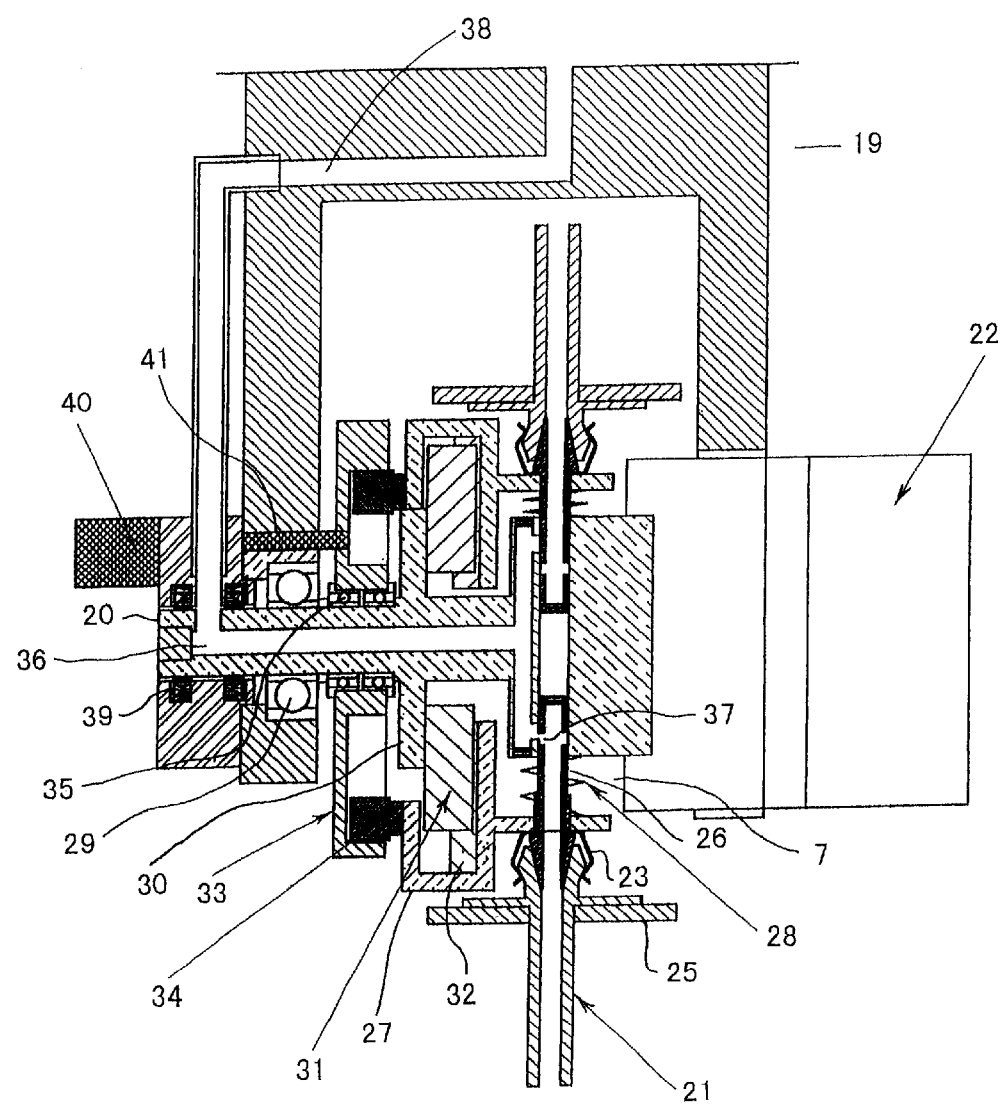
FIG. 5 is a cross-sectional view of a mounting head and its related portions in an embodiment of the present invention.

As shown in FIG. 5, when a suction nozzle 21 selected for a mounting operation is brought down to the pick-up position of electronic component 10 by the rotation of the nozzle selection motor 22, an opening for connection 37 created at the end of the nozzle fixture 26 is connected to the vacuum line 36 inside the horizontal-axis component 20 as the suction nozzle 21 comes to the outer most position following the cum 33, the bottom inside surface of which is at the lowest level in this configuration. Furthermore, this configuration is secured as the cum follower 34 rests in a dent portion 42 of the cum 33.

In this configuration shown in FIG. 5, a vacuum circuit for picking up electronic component is formed by connecting the suction nozzle to a vacuum source not shown in the figure through the opening for connection 37, the vacuum line 36, and main vacuum line 38.

A sealing portion 39 for securing the vacuum system is made of rubber material. The locking mechanism consists of an air cylinder 40 and a rod 41. When the locking mechanism is activated, the air cylinder 40 pushes the rod 41 into an opening of the cum 33 and the movement thereof is restrained while the horizontal-axis component 20 rotates through bearings 29, 35 driven by the nozzle selection motor 22. When the locking mechanism is not activated, the rod 41 stays out of the opening of the cum 33 and the horizontal-axis component 20 rotates with the cum 33 as the cum follower 34 is forcibly pushed against the inside surface of the cum 33 by the spring 28 for creating frictional force enough to carry the cum 33. In the configuration where the locking mechanism is off, the vacuum circuit for picking up electronic component formed by connecting the suction nozzle to the vacuum source through the opening for connection 37, the vacuum line 36, and main vacuum line 38 is sustained while the suction nozzle 21 rotates by 90 degree from the pick-up position of electronic components 10 to an observation position for electronic components, which will be later described. Thus, the suction nozzle does not loose the electronic component while it moves between the pick-up position 10 and the observation position.

Although in this embodiment the locking mechanism adopts an air cylinder 40 for inserting the rod 41 into the opening of the cum 33, other pushing means such as a solenoid can also be adopted.

The observation on the position of electronic components is performed by an observation camera 45, which is placed under the X-moving unit 13 through a fixture frame 46 with its optical axis being horizontally aligned, as shown in FIG. 3. The observation camera 45 is placed under each X-moving unit 13 and moves with the mounting head 7 in accordance with the movement of the X-moving unit 13. The observation camera 45 detects the shift of the suction nozzle relative to an electronic component 24 from a proper position for holding the electronic component, in the X and Y directions as well as the rotation. The detected data is sent to a control means (CPU) which uses the data for continuing proper mounting operation.

Figure 8:
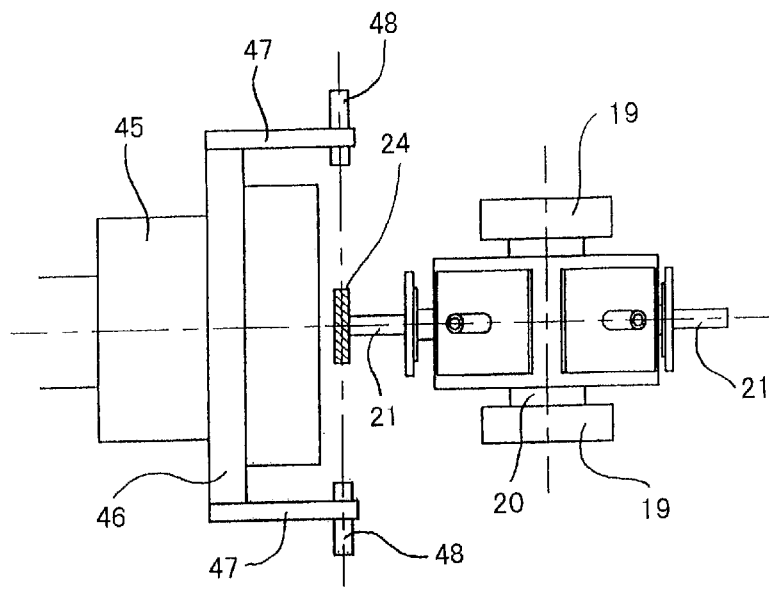
FIG. 8 shows an observation camera and a component detecting sensor in an embodiment of the present invention.
Figure 9:
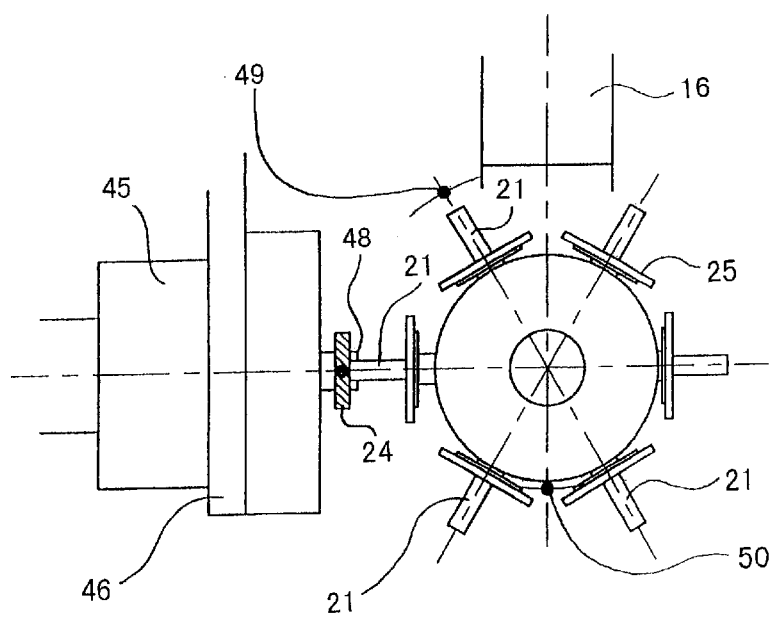
FIG. 9 shows an observation camera, and two sensors for detecting the presence and the length of the suction nozzle.
Figure 10:
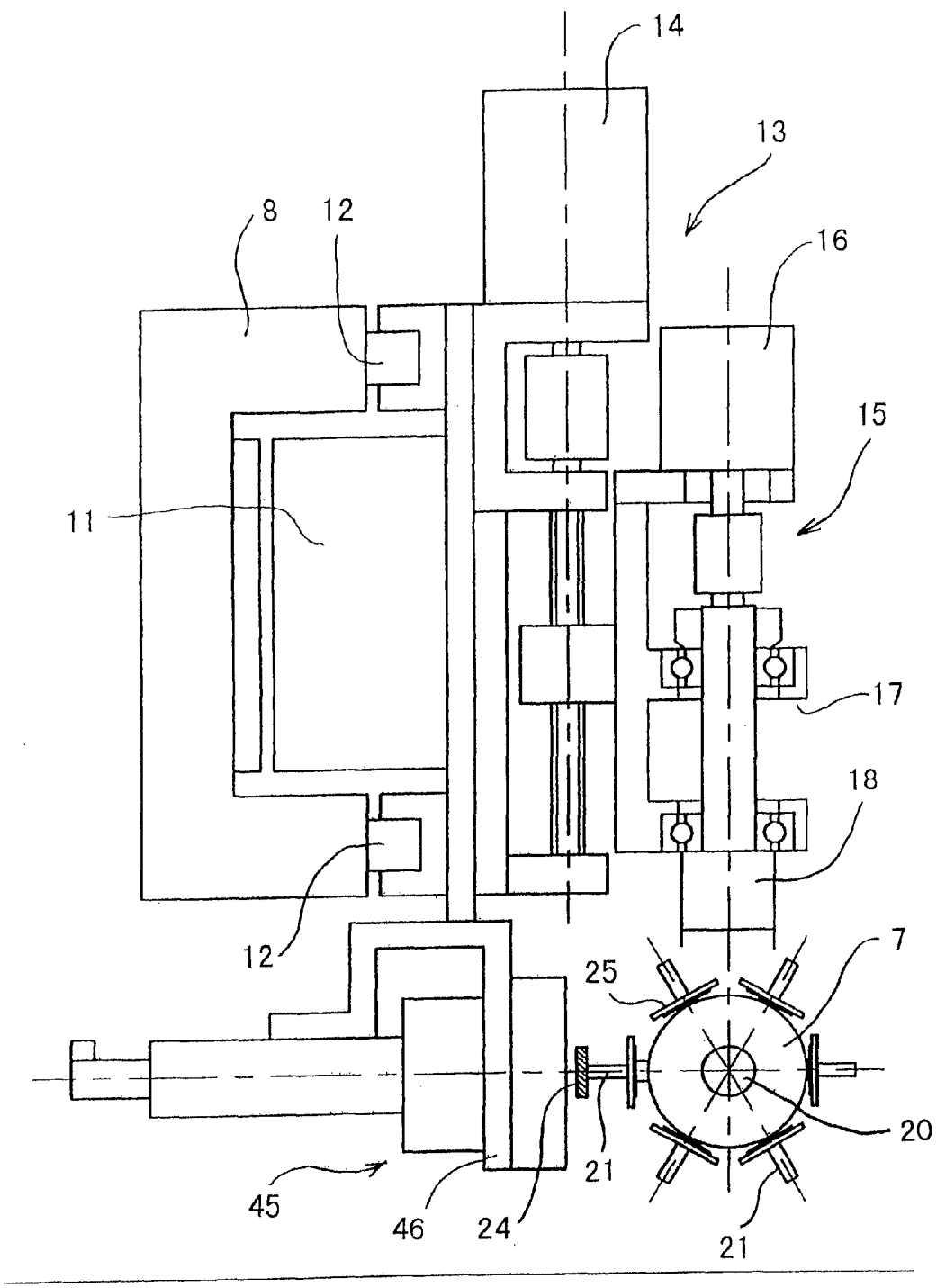
FIG. 10 is to show an electronic component observed by an observation camera, and a side view of the apparatus shown in FIG. 1 being viewed from the direction shown as A in the figure.

In some embodiments, various sensors are used as shown in FIG. 8 and FIG. 9. First, a pair of component detection sensors is placed on arms 47, which is fixed on both sides of the fixture frame 46 of the observation camera 45. In FIG. 9, the one on the front is shown but another on the back is not shown. Whether the nozzle 21 holds an electronic component is judged by the transmission of a light beam between a light emitting device and a light receiving device, which compose a pair of component detection sensors 48. This type of component detection sensor will be termed as an optical sensor hereinafter. In this particular embodiment, the light beam passes through the location denoted by a black dot on the electronic component shown in FIG. 9, and the holding of the electronic component 24 by the suction nozzle 21 is conformed when the light reception device does not receive the light beam which is deflected by the electronic component 24.

The detection procedure described above is performed while the observation camera 45 observes the position of electronic component 24 held by the suction nozzle 21 which moves to the position facing the observation camera 45 for observation by a 90 degree rotation of the mounting head 7 from the pick-up position 10 for picking up the electronic component 24 from the component feeding unit 3. When it is confirmed by the optical sensor that the suction nozzle does not hold the electronic component 24, the control means (CPU) will discontinue the mounting operation for the electronic component 24. Though it is possible to detect the holding of the electronic component 24 by the suction nozzle 21 using the image of the component 24 obtained from the observation camera 45, the image processing for the detection is complicated and thus the component detection sensor is used as a convenient and practical detection means.

Secondly, a sensor is placed at a location denoted by the black dot 49 in FIG. 9 for detecting the length of the suction nozzle 21. This sensor is also an optical sensor having its beam passing through the block dot 49. The objective for having this sensor is to detect a suction nozzle 21 which is erroneously placed in the mounting head and has longer length than a proper nozzle. When such nozzle is placed in the mounting head 7, it deflects the light beam of the optical sensor and the sensor accordingly detects the erroneously placed suction nozzle 21 in the mounting head 7. Then, the control means (CPU) informs the operator of the error in selecting the suction nozzle 21 using an alarming means. This detection procedure is performed before the actual mounting operation of the electronic component 24. Typically, the procedure is performed at the time of system activation and changing the suction nozzle 21.

Though this sensor is not shown in the figures, it is placed on arms 47, which is fixed on both sides of the fixture frame 46 of the observation camera 45 as is the case with the component detection sensor 48 shown in FIG. 8.

Thirdly, a sensor is placed at a location denoted by the black dot 50 in FIG. 9 for detecting the suction nozzle 21. The sensor is located at the bottom of the mounting head 7 because this position is suitable for detecting the suction nozzle 21 ready for picking up the electronic component 24. This sensor is also an optical sensor having its beam passing through the block dot 50. Though this sensor is not shown in the figures either, it is placed on arms 47, which is fixed on both sides of the fixture frame 46 of the observation camera 45 again as is the case with the component detection sensor 48 shown in FIG. 8.

This detection procedure is not performed during regular pick-up procedure for picking up the electronic component 24, but performed after a new suction nozzle 21, which is not identical to any suction nozzle 21 already placed in the mounting head 7, replaces a suction nozzles 21 in the mounting head 7. The suction nozzles which are not used are stored in a nozzle stocker 51 shown in FIG. 1, and picked up by the mounting head 7 for use when the replacement is needed.

The objective for having this sensor is to prevent such an event that the mounting head 7 unnecessarily descends to the nozzle stocker 51 for changing a suction nozzle 21 when a required suction nozzle 21 is already placed in the mounting head 7 and the apparatus main body 1 fails to recognize the change of the suction nozzles 21. For example, if an operator manually replaces one of the suction nozzles 21 of the mounting head 7 with a new one, or places a new one in an unused nozzle holder of the mounting head 7, the apparatus main body fails to recognize such change and assumes that the new nozzle is not yet placed in the mounting head 7. However, the unnecessary procedure for automatically changing the suction nozzle 21, which is already in place manually, is avoided when the detection sensor is provided for detecting the suction nozzle 21 placed in the mounting head 7. Thus, it is possible to prevent such an event that the mounting head 7 unnecessarily descends to the nozzle stocker 51 for changing a suction nozzle 21 when a required suction nozzle 21 is already placed in the mounting head 7.

In other embodiment, a line sensor can be used in place of the component detection sensor 48 in FIG. 8. Such line sensor does not only detect the presence of the component, but also judges whether the component is held by the suction nozzle 21 in a proper posture. An example of such line sensor is described in U.S. Pat. No. 5,539, 977.

Based on the configurations described above, the procedures of the mounting operation with the apparatus of the present invention will be described hereinafter.

First, a print circuit board P is transported to the incoming conveyer 4 from an upstream apparatus by another conveyer not shown in figures, then transported to the portion for positioning 5 by the incoming conveyer 4, and positioned for mounting electronic components by a positioning means.

Then, the suction nozzle 21 picks up a proper electronic component 24 from a proper component feeding unit 3 by the sucking mechanism of the suction nozzle 21 based on a set of data for mounting including the X and Y coordinates of the location for mounting on the print circuit board P, a rotation angle around a vertical axis for mounting, and the type of the component to be mounted. During this procedure, the two mounting heads 7 operate independently and concurrently for picking up the electronic components 24.

The two mounting heads 7 move independently and concurrently to the positions above the proper component feeding units 3 containing the proper electronic components 24 for the mounting operation. The two X-moving units 13 having the mounting heads 7 simultaneously move along the Y direction on the beam traveling on a pair of guides 9, and independently move along the X direction on the guide 12 driven by the X-axis linear motor 11.

At this point, the component feeding units 3 have already fed the proper electronic components to the pick-up position of electronic components 10. The mounting head 7 rotates and the suction nozzle 21 needed for the mounting operation comes to the bottom of the mounting head 7 facing downward to the electronic component to be picked up. During the rotation, the locking mechanism is activated, and the nozzle 21 rotates guided by the cum follower 34, which is fixed on the fringe portion of the side wall of the nozzle holder 27 and pushed by the spring 28 against the inside surface of the cum 33, which is placed around the horizontal-axis component 20 rotating through bearings 29 driven by the nozzle selection motor 22. Furthermore, this downward position of the suction nozzle 21 is secured as the cum follower rests in the dent portion 42. This configuration, as shown in FIG. 5, forms a vacuum circuit for picking up electronic component by connecting the suction nozzle 21 to a vacuum source through the opening for connection 37 created at the top end of the hollow nozzle fixture 26, the vacuum line 36, and the main vacuum line 38. Then, the suction nozzle 21 descends to the electronic component with the lowering of the head block 15 driven by the vertical-axis motor 14, and picks up the component by the sucking mechanism of the suction nozzle 21 using the vacuum line.

After picking up the components, the two mounting heads 7 ascend away from the component feeding unit 3 driven by the vertical-axis motor 14, and move to the position above the print circuit board P. Again, the two X-moving units 13 having the mounting heads 7 simultaneously move along the Y direction on the beam traveling on the pair of guides 9, and independently move along the X direction on the guide 12 driven by the X-axis linear motor 11. During the travel to the print circuit board P, the mounting heads 7 rotate to the position for observing electronic components by 90 degree and the observation camera 45 detects the shift of the suction nozzle relative to the electronic component 24 from a proper position for holding the electronic component, in the X and Y directions as well as the rotation. The reference points of the shift measurement, in this embodiment, are the center of the suction nozzle 21 and the center of the electronic component 24, and the proper holding is achieved when the center of the nozzle 21 is at the center of the electronic component 24. The calculation for enumerating the shift based on the imaging by the observation camera 45 is performed by the CPU not shown in the figure. During the imaging of the electronic components 24, the components are illuminated by the light coming from a light source and then reflected on the reflection plate.

Figure 11:
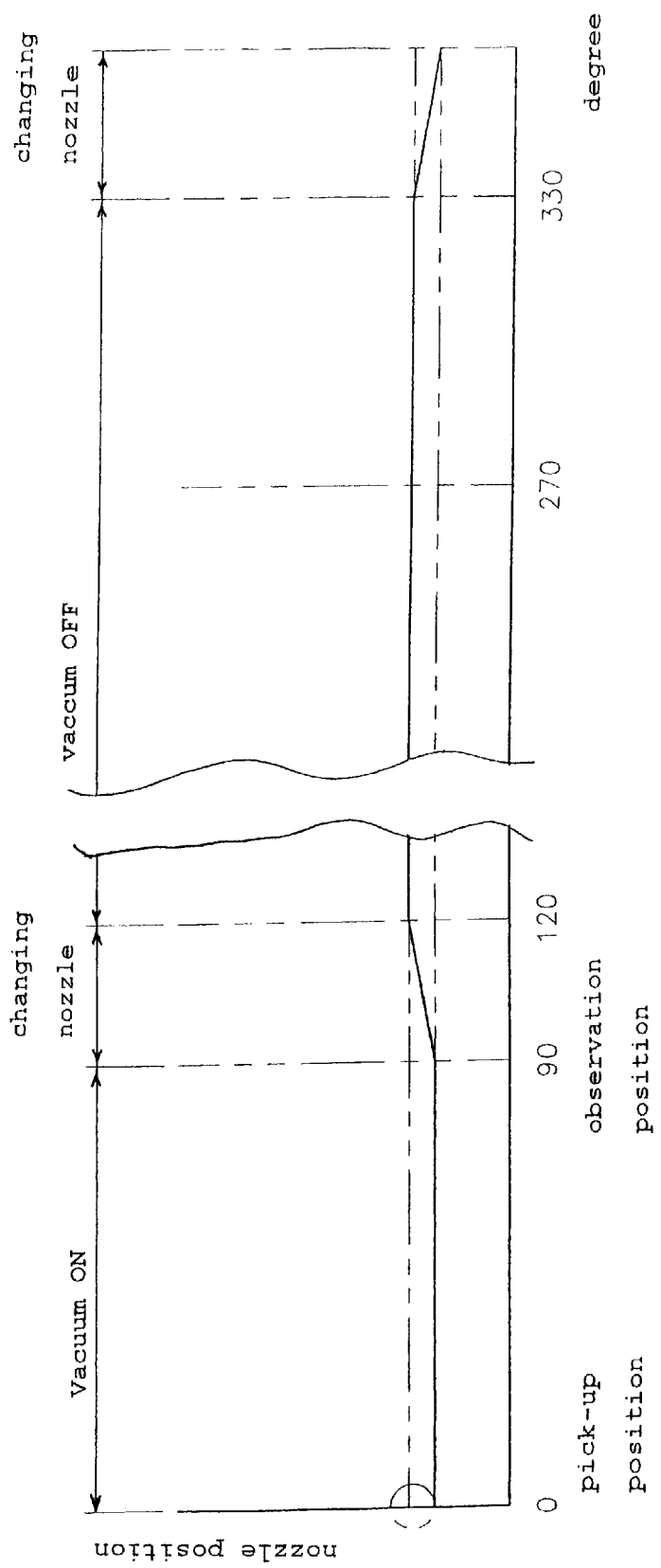
FIG. 11 shows the status of the vacuum level and the nozzle height as a function of the nozzle position of the mounting head.

When the suction nozzle 21 holding the electronic component rotates to the position for the observation by the observation camera 45 being driven by the nozzle selection motor 22, the locking mechanism is not activated and the rod 41 stays out of the opening of the cum 33. Thus, the horizontal-axis component 20 rotates with the cum 33 as the cum follower 34 is forcibly pushed against the inside surface of the cum 33 by the spring 28 for creating frictional force enough to carry the cum 33. In this configuration, the vacuum circuit for picking up electronic component formed by connecting the suction nozzle to the vacuum source through the opening for connection 37, the vacuum line 36, the main vacuum line 38, and a switching bulb connecting to the vacuum source (not shown in the figure) is sustained while the suction nozzle 21 rotates by 90 degree from the downward position to the observation position for electronic components. A sequence of the suction nozzle 21 operation in an embodiment of the present invention is shown in FIG. 11.

In the mean time, the detection of the electronic component is performed by the component detection sensor 48 while the observation camera 45 observes the position of electronic component 24 held by the suction nozzle 21 which moves to the position facing the observation camera 24 for observation by a 90 degree rotation of the mounting head 7 from the downward position 10. When it is confirmed by the optical sensor that the suction nozzle does not hold the electronic component 24, the control means (CPU) will discontinue the mounting operation for the electronic component 24.

Also during the travel to the print circuit board P, after the observation procedure the suction nozzles rotate 21, by 90 degrees, back to the downward position driven reversely by the nozzle selection motor 22. Then, the result of the observation of the position of the electronic component held by the suction nozzle 21 is used, by the control means (CPU) for adjusting the posture of the component. The deviation from the proper position for mounting in Y direction is compensated by properly moving the beam 8 along the Y direction, and that in X direction is compensated by properly moving the X-moving unit using the X-axis linear motor 11 in the X direction. The rotational deviation around the vertical axis is compensated by rotating the mounting head 7 using the angle correction motor 16.

After the adjustment on the position of one of the two electronic components 24, the suction nozzle 21 having the same electronic component 24 comes down to a position for mounting as the head block 15 descends driven by the vertical-axis motor 14, and the electronic component 24 is mounted on the print circuit board P. Then, the head block 15 ascends with the suction nozzle 21 without any component away from the print circuit board P, and another electronic component 24 is mounted on the print circuit board P after the position of the component is adjusted, especially including the position along the Y direction which may be different from that of the first component.

The aforementioned mounting procedure is repeated a number of times in a typical mounting operation. In an embodiment of the present invention, the results of the first three observations on the position of an electronic component 24 picked up from a same component feeding unit 3 are stored in a memory means, and used by the control means (CPU) to calculate the average bias shift of the suction nozzle relative to the electronic component from a proper position for picking up the electronic component. In the mounting procedure on the same electronic component 24 after the bias shift is thus calculated, the average bias shift along the direction of component feeding of the component feeding unit 3 (Y direction in FIG. 1) is corrected by rotating the mounting head when the suction nozzle picks up the electronic component from the same component feeding unit 3.

Figure 12:
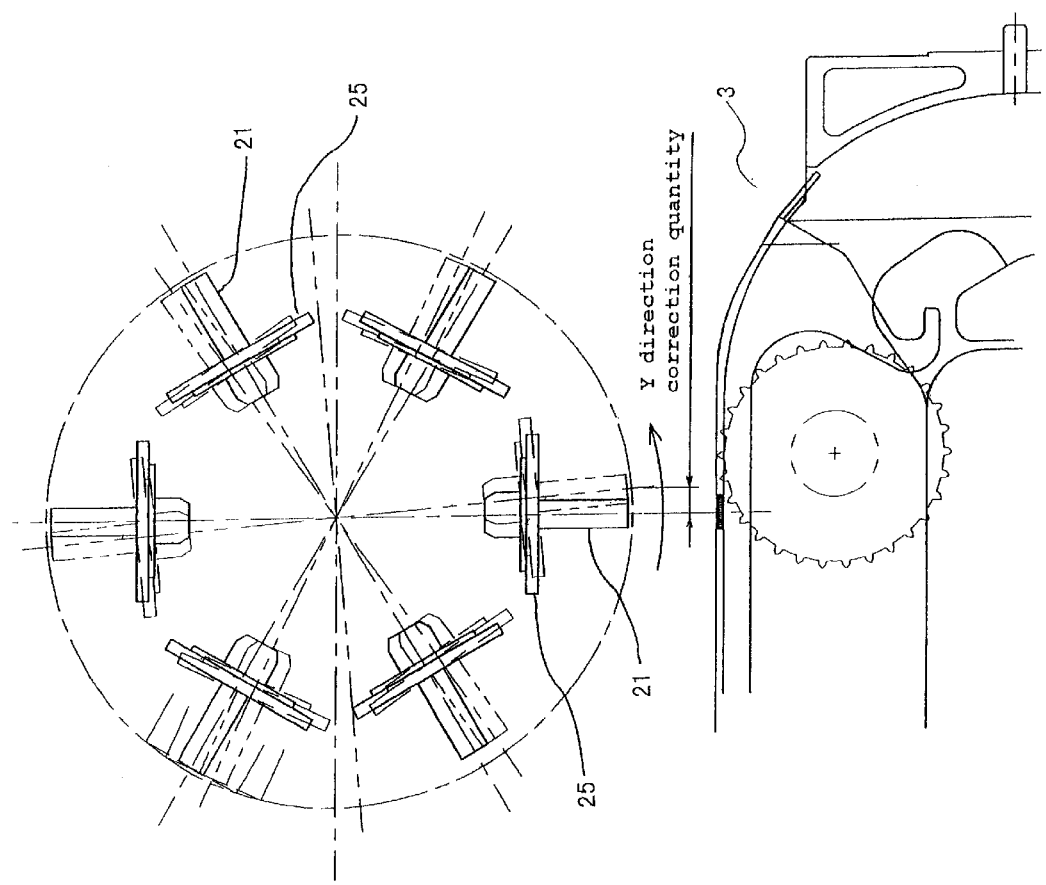
FIG. 12 is to conceptually show the correction of the bias shift along the Y direction when the electronic component is picked up by the suction nozzle.

The component feeding units do not always have an identical pick-up position among all the units used in a mounting operation. Rather, there is a variation in such position along the direction of component feeding because the component feeding units are not always made identically and because the units are not necessarily mounted on the main body of the mounting apparatus with a good reproducibility. The fact that the electronic component may be stored in a varying positioning within a compartment of a tape containing the electronic components also gives rise to this variation. This causes a need for correcting the bias shift for each of the component feeding unit 3. This correction is made, as shown in FIG. 12, by changing the position of the suction nozzle 21 along the Y direction by rotating the mounting head 7 by a small amount using the nozzle selection motor 22 when the nozzle 21 picks up the electronic component 24. This adjustment makes it certain that the suction nozzle 21 approaches the middle portion of the electronic component for the proper holding thereof. This approach is especially effective when the electronic component to be picked up is as small as so-called 1005 components (1 mm×0.5 mm). As far as the adjustment scheme with the two-mounting heads 7 apparatus, the rotations of the two mounting heads 7 can be adjusted together, or only one of the two can be adjusted with another being fixed at a constant position. In the later case, the shift along the Y direction of the electronic component picked up by the constant-position mounting head 7 is corrected by the movement of the beam along the Y direction.

When a suction nozzle 21 which is not placed in the mounting head 7 is needed for the mounting operation, the mounting head 7 moves to the position above the nozzle stocker 51 on the base 2. Then, the mounting head 7 finds a slot within the nozzle stocker 51 not occupied by a suction nozzle 21, descends to the slot, disengage the nozzle 21 to be replaced from the nozzle fixture 26, and put the nozzle 21 back to the nozzle stocker 51. For obtaining the new suction nozzle 21, the mounting head 7 ascends, moves to the position above the new nozzle 21 required in the mounting operation, descends to the nozzle 21, and engage the nozzle 21 with the nozzle fixture 26. Then, the mounting head 7 ascends, and continues the mounting operation.

Before the first mounting procedure on the electronic component 24, which has required the changing of the suction nozzle 21, the length of the new suction nozzle 21 is examined by the optical sensor placed at the position denoted by the black dot 49 in FIG. 9. When a longer suction nozzle 21 than the one required is placed in the mounting head 7 by mistake, the nozzle 21 deflects the light beam coming from the light emitting device and the light receiving device detects such an error by not receiving the light beam. After the detection by the optical sensor, the control means (CPU) informs the operator of the error in selecting the suction nozzle 21 using an alarming means.

Then, the new suction nozzle 21, which is placed in the mounting head 7 after a regular replacement procedure or after the detection of the selection error, rotates to the downward position for picking up the electronic component 24. At this position, the other optical sensor placed at the position denoted by the black dot 50 in FIG. 9 detects the suction nozzle 21. Even when the new nozzle is placed in the mounting head 7 manually and the apparatus main body 1 does not recognize the event, the presence of the suction nozzle 21 is recognized by the sensor and the unnecessary procedure for automatically changing the suction nozzle 21, such as descending the mounting head 7 again to the nozzle stocker 51, is avoided.

In the aforementioned embodiments, one mounting head 7 picks up only one electronic component 24 in a single mounting procedure. In other embodiment, one mounting head 7 picks up a plurality of electronic components 24 using corresponding number of the suction nozzles 21, transports the electronic components 24, and mounts the electronic components 24 on the print circuit board P in a single mounting procedure. This can be achieved by providing each suction nozzle 21 with the switching bulb for connecting the vacuum line to the vacuum source, and assuring the simultaneous connection of all the vacuum lines of the section nozzles to the vacuum source.

Although the mechanical configuration of this embodiment is similar to that of the aforementioned embodiments, the operation program is altered to accommodate the following change in the operational sequence. Firstly, after one suction nozzle 21 of a mounting head 7 picks up an electronic component 24, the mounting head 7 ascends and rotates for moving other suction nozzle 21 to the downward position for the pick-up. Then, the mounting head 7 moves to the position above other feeding unit 3, and descends for picking up other type of electronic component from the feeding unit 3. This pick-up procedure can be repeated as many times as the number of the nozzles 21 in the mounting head 7.

Secondly, while the mounting heads 7 carrying a plurality of the electronic components moves to the position above the print circuit board P, the mounting head 7 rotates so that each electronic component 24 comes to the position for the observation by the observation camera 45. Each electronic component 24, turn by turn, stops at the position and has the position of the nozzle 21 relative to the component 24 observed by the observation camera 45. This observation can be performed during the pick-up procedure, if one of the electronic components 24 already picked up by a nozzle happens to face the observation camera 45 while other electronic component 24 is being picked up by other nozzle.

Thirdly, the mounting on the print circuit board P is performed on the electronic components 24 held by the mounting heads 7 starting from the electronic component 24 held by a suction nozzle 21 which is already at the downward position for the mounting. Before the mounting, however, the deviation from the proper position for mounting, which is observed by the observation camera 45, is compensated. The deviation in Y direction is compensated by properly moving the beam 8, and that in X direction is compensated by properly moving the X-moving unit. The rotational deviation is compensated by rotating the mounting head 7 using the angle correction motor 16. Then, the mounting head 7 moves to the position for other mounting, and mounts other electronic component 24 on the print circuit board P after the positional deviations are compensated. The other remaining electronic components 24 still held by the mounting head 7 are mounted, turn by turn, in the same manner.

In the aforementioned embodiments, the bias shift of the suction nozzle relative to an electronic component is calculated after the first three mounting procedures on the same electronic component, and then the result is used in the fourth or later mounting procedure in which the mounting head rotates to correct the bias shift along the feeding direction. In other embodiment, the number of the mounting procedures to calculate the bias shift is lower or higher than three. In yet other embodiment, the bias shift is estimated during a preparatory testing before a mounting operation, and the result is used in the subsequent mounting operation for securely picking up and holding the electronic components. Furthermore, the mounting operation can start using the bias shift, which is obtained at the preparatory testing or after the first few mounting procedures, and then during the course of the mounting operation the bias shift can be calculated again based on the data gathered from a certain number of the mounting procedures and used for further improving the secure pick-up and holding of the electronic components.

In the aforementioned embodiments, the mounting head is aligned in parallel with the Y direction, which is the direction of the component feeding, and rotates around a horizontal axis in parallel with the X direction, which is the direction of print circuit board transportation. However, the present invention is not confined to this configuration. For example, the axis of the rotation of the mounting head can be inclined with respect to the X direction. More specifically, the rotation axis can stay within the plane perpendicular to the Y direction and be inclined with respect to the X direction.

While the invention has been described and illustrated with respect to a few embodiments, it will be understood by those skilled in the art that various other changes and modifications may be made without departing from the spirit and scope of the invention. All such modifications are intended for inclusion within the scope of the following claims.

What is claimed is:

1. An apparatus for mounting electronic components having a plurality of component feeding units and a plurality of mounting heads, said mounting heads picking up electronic components concurrently from the component feeding units for mounting the electronic components on a print circuit board, the apparatus comprising:

a plurality of suction nozzles disposed on the mounting head in a radial configuration;

means for rotating the mounting head around a horizontal axis thereof such that the suction nozzles rotate around said axis, the horizontal axis being located approximately at a center of the mounting head;

means for moving the mounting head horizontally for picking up and mounting the electronic components; and means for correcting a bias shift of the suction nozzle relative to the electronic component from a proper position for picking up the electronic component along a direction of component feeding of the component feeding unit by rotating the mounting head around said horizontal axis.

2. An apparatus for mounting electronic components according to claim 1, wherein said bias shift is estimated from a predetermined number of pick-up procedures of the electronic component by the suction nozzle at an occasion of a production operation.

3. An apparatus for mounting electronic components according to claim 2, wherein said occasion of a production operation for estimating the bias shift is a preparatory testing before a mounting operation, at a start of a mounting operation, or at a time in the middle of a mounting operation.

* * * * *